United States Patent
Yu et al.

(10) Patent No.: US 9,960,330 B2
(45) Date of Patent: May 1, 2018

(54) FLIP-CHIP SIDE EMITTING LED WITH TOP REFLECTOR, PERIPHERAL WAVELENGTH CONVERSION ELEMENT, AND OPTICAL ELEMENT BETWEEN LIGHT EMITTING ELEMENT AND LIGHTGUIDE ELEMENT

(71) Applicant: KONINKLIJKE PHILIPS N.V., Eindhoven (NL)

(72) Inventors: Jianghong Yu, San Jose, CA (US); Nicolaas Joseph Martin Van Leth, San Jose, CA (US); Giovanni Cennini, San Jose, CA (US); Kenneth Vampola, San Jose, CA (US); Hugo Johan Cornelissen, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days. days.

(21) Appl. No.: 14/906,533

(22) PCT Filed: Jul. 9, 2014

(86) PCT No.: PCT/IB2014/062958
§ 371 (c)(1),
(2) Date: Jan. 20, 2016

(87) PCT Pub. No.: WO2015/011590
PCT Pub. Date: Jan. 29, 2015

(65) Prior Publication Data
US 2016/0163938 A1    Jun. 9, 2016

Related U.S. Application Data

(60) Provisional application No. 61/856,786, filed on Jul. 22, 2013.

(51) Int. Cl.
*H01L 33/60* (2010.01)
*H01L 33/46* (2010.01)
(Continued)

(52) U.S. Cl.
CPC .............. *H01L 33/60* (2013.01); *H01L 33/46* (2013.01); *H01L 33/501* (2013.01);
(Continued)

(58) Field of Classification Search
CPC ....... H01L 33/60; H01L 33/46; H01L 33/601; H01L 33/505
See application file for complete search history.

(56) References Cited

U.S. PATENT DOCUMENTS 7,344,952 B2   3/2008  Chandra
8,109,644 B2   2/2012  Bierhuizen
(Continued)

FOREIGN PATENT DOCUMENTS

EP    1432046 A2    6/2004
JP    2008205410 A  9/2008
(Continued)

OTHER PUBLICATIONS

EPO as ISA, PCT/IB2014/062958, filed Jul. 9, 2014, "International Search Report and Written Opinion" dated Nov. 3, 2014, 12 pages.
(Continued)

*Primary Examiner* — Benjamin Sandvik
*Assistant Examiner* — Gustavo Ramallo

(57) ABSTRACT

Application of a wavelength conversion element is substantially independent of the fabrication of a side-emitting light emitting device. In an example embodiment, the wavelength conversion element is situated around the periphery of a non-wavelength converting lightguide that is situated above the light emitting surface. One or more specular and/or diffusing reflectors are used to direct the light in the lightguide toward the wavelength conversion element at the periphery. In another embodiment, an interference filter may be used to provide predominantly side-emitted light at interfaces between the elements of the light emitting device.

22 Claims, 4 Drawing Sheets

(51) Int. Cl.
*H01L 33/50* (2010.01)
*H01L 33/58* (2010.01)

(52) U.S. Cl.
CPC ............ *H01L 33/505* (2013.01); *H01L 33/58* (2013.01); *H01L 2933/0041* (2013.01); *H01L 2933/0058* (2013.01)

(56) References Cited

U.S. PATENT DOCUMENTS

| | | |
|---|---|---|
| 2006/0208269 A1 | 9/2006 | Kim et al. |
| 2007/0085105 A1* | 4/2007 | Beeson .................. H01L 33/58 257/100 |
| 2007/0267646 A1 | 11/2007 | Wierer et al. |
| 2007/0284600 A1* | 12/2007 | Shchekin ................ H01L 33/46 257/98 |
| 2008/0061310 A1 | 3/2008 | Chiu et al. |
| 2008/0089062 A1* | 4/2008 | Vennetier ............ G02B 19/0071 362/241 |
| 2010/0117111 A1* | 5/2010 | Illek ..................... H01L 33/382 257/98 |
| 2011/0012148 A1* | 1/2011 | Bierhuizen ........... H01L 33/486 257/98 |

FOREIGN PATENT DOCUMENTS

| | | |
|---|---|---|
| WO | 2007141763 A1 | 12/2007 |
| WO | 2011007277 A2 | 1/2011 |

OTHER PUBLICATIONS

JJ Wierer, et al, "InGaN—GaN quantum-well heterostructure light-emitting diodes employing photonic crystal structures", Applied Physics Letters vol. 84, No. 19, May 10, 2004, pp. 3885-3887.
T. Lopez, U.S. Appl. No. 61/836,775, filed Jun. 19, 2013, "LED With Patterned Surface Features Based on Emission Field Patterns".
First Office Action dated May 22, 2017, China Patent Application No. 201480041797.8, 28 pages.
Second Office Action issued 09 Feb. 2018, China Patent Application No. 201480041797.8, 20 pp.. X.

* cited by examiner

FLIP-CHIP SIDE EMITTING LED WITH TOP REFLECTOR, PERIPHERAL WAVELENGTH CONVERSION ELEMENT, AND OPTICAL ELEMENT BETWEEN LIGHT EMITTING ELEMENT AND LIGHTGUIDE ELEMENT

CROSS-REFERENCE TO RELATED APPLICATIONS

The present application is a § 371 application of International Application No. PCT/IB2014/062958 filed on Jul. 9, 2014 and entitled "FLIP-CHIP SIDE EMITTING LED," which claims the benefit of U.S. Provisional Application Ser. No. 61/856,786, filed Jul. 22, 2013. Both PCT/IB2014/062958 and U.S. 61/856,786 are incorporated herein.

FIELD OF THE INVENTION

This invention relates to the field of light emitting devices (LEDs), and in particular to side-emitting light emitting devices with wavelength conversion elements.

BACKGROUND OF THE INVENTION

The ever expanding use of semiconductor light emitting devices has produced a highly competitive market for these devices. In this market, performance and price are often significant for providing product distinction among vendors.

Side-emitting LEDs are commonly used in applications requiring a low profile device and a dispersed light pattern, such as backlighted display panels, and thin troffers for general illumination. FIGS. 1A-1C illustrate a conventional technique for providing a side-emitting device, such as disclosed in U.S. Pat. No. 8,109,644, issued 7 Feb. 2012 to Serge Bierhuizen, and incorporated by reference herein.

FIG. 1A illustrates a substrate 110, upon which semiconductor layers are formed/grown to create multiple light emitting elements 120. The substrate 110 is commonly sapphire, SiC or GaN, and the light emitting element 120 is commonly an active region sandwiched between an n-type semiconductor layer and a p-type semiconductor layer. Pads 130 provide contact to the n and p layers, such that when current flows between these layers, light is emitted from the active region. Gallium nitride (GaN), doped to provide the n-type and p-type semiconductors, is commonly used as the semiconductor forming the light emitting element 120.

The substrate 110 may be sliced/diced to provide singular light emitting chips, which may be subsequently placed on another substrate 140, commonly termed a submount, in a 'flip-chip' orientation (pads 130 being on the 'bottom' of the chip), as illustrated in FIG. 1B. The pads 130 are coupled to contacts 145 on the submount 140 to allow for external electrical connection to the light emitting element 120. With the submount providing structural support to the light emitting element 120, the substrate 110 may be removed.

To provide a desired color point (hue and color temperature), a wavelength conversion element 150 is placed upon the light emitting surface 125 of the light emitting element 120, to provide a light emitting device 100 as illustrated in FIG. 1C. The wavelength conversion element may contain one or more wavelength conversion materials, such as phosphors. To provide side emissions, a reflector 160 is situated above the wavelength conversion element 150, so that the light is emitted through the sidewalls 155 of the wavelength conversion element 150. The reflector 160 may be a specular reflector or a diffusing reflector.

In some embodiments, light is emitted from all sidewalls of the wavelength conversion element 150; in other embodiments, one or more of the sidewalls of the wavelength conversion element 150 may be reflective, thereby causing the light to be emitted from the remaining non-reflective sidewall(s) 155. Optionally, one or more optical elements, such as collimators, may be used to further direct the side-emitted light in a desired direction.

Generally, the wavelength conversion element 150 is attached to the light emitting element 120 soon after the substrate 110 is removed, to protect the light emitting surface 115. Accordingly, the choice of a wavelength conversion element 150 having particular characteristics is generally made prior to the manufacture of the device 100.

SUMMARY OF THE INVENTION

It would be advantageous to provide a light emitting device using a potentially simpler manufacturing process. It would also be advantageous to provide a light emitting device with potentially higher light output, and potentially more consistent color.

To better address one or more of these concerns, in an embodiment of this invention, the application of a wavelength conversion element is substantially independent of the fabrication of a side-emitting LED. In an example embodiment, the wavelength conversion element is situated around the periphery of a non-wavelength converting lightguide that is situated above the light emitting surface. One or more specular and/or diffusing reflectors are used to direct the light in the lightguide toward the wavelength conversion element at the periphery. In another embodiment, an interference filter may be used to provide predominantly side-emitted light at interfaces between the elements of the LED.

In an example embodiment, the side-emitting device comprises a light emitting element having a light emitting surface that emits light in an upward direction, a non-wavelength-converting lightguide element that is situated above the light emitting surface, receives the light emitted from the light emitting element, and emits the light from one or more side surfaces of the lightguide element, one or more wavelength conversion elements situated alongside the lightguide element to receive the light emitted by the lightguide element and convert some or all of the light to light of a different wavelength, and one or more specular or diffuse reflectors situated above the lightguide element.

In some embodiments, the specular reflector is situated above the lightguide element, and the diffusing reflector is situated above the specular reflector, the diffusing reflector serving to reduce the appearance of a 'dark spot' when viewed from above.

In some embodiments, the lightguide element comprises the growth substrate upon which the light emitting element was formed. The lightguide element may comprise sapphire, glass, transparent ceramic, and other transparent non-wavelength converting materials.

To enhance the side emissions, the light emitting element may be configured to provide a light output pattern from the light emitting surface with a luminance in at least one direction that is greater than the luminance in a direction normal to the surface, using, for example, photonic crystals, interference filters, and the like.

An additional optical element may be situated between the light emitting element and the lightguide element, preferably with an index of refraction greater than the index of refraction of the lightguide element. The optical element may include the growth substrate upon which the light emitting element was formed, and may comprise sapphire, glass, or other transparent material, including transparent ceramic.

Reflective walls may be situated at the periphery of the optical element, or the wavelength converting material may extend down to include the periphery of the optical element. Reflective walls may also be used to direct the emitting light toward a select side, or sides, of the side-emitting light emitting device.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
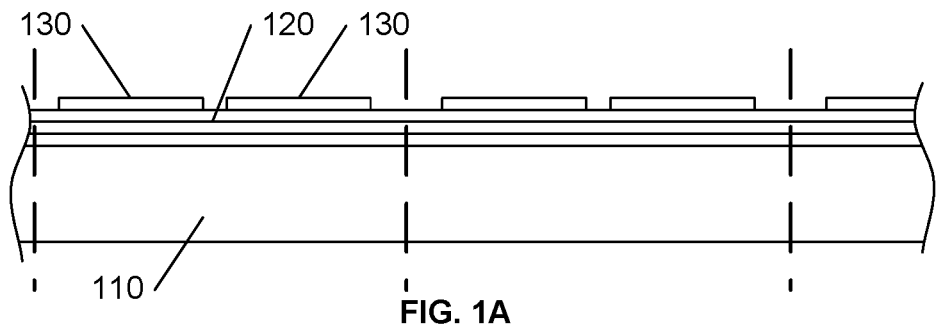
FIGS. 1A-1C illustrate the manufacture of an example prior art side-emitting LED.
Figure 1B:
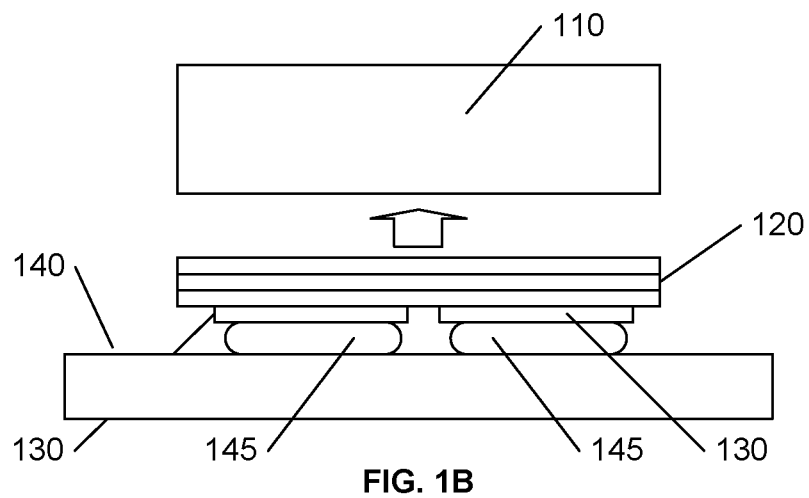
Figure 1C:
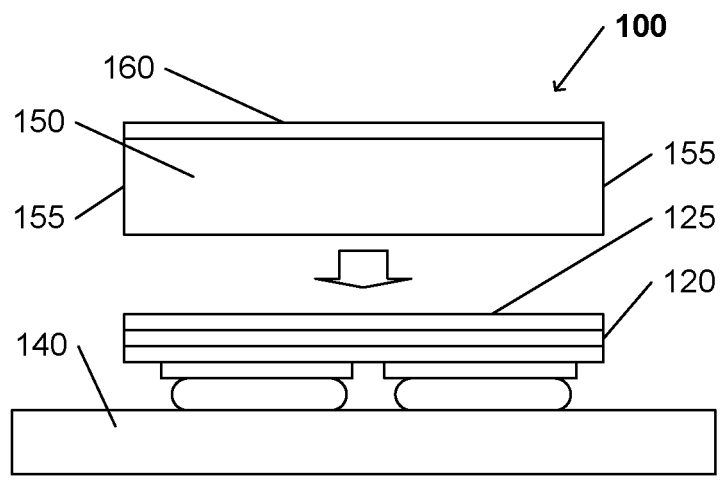
Figure 2A:
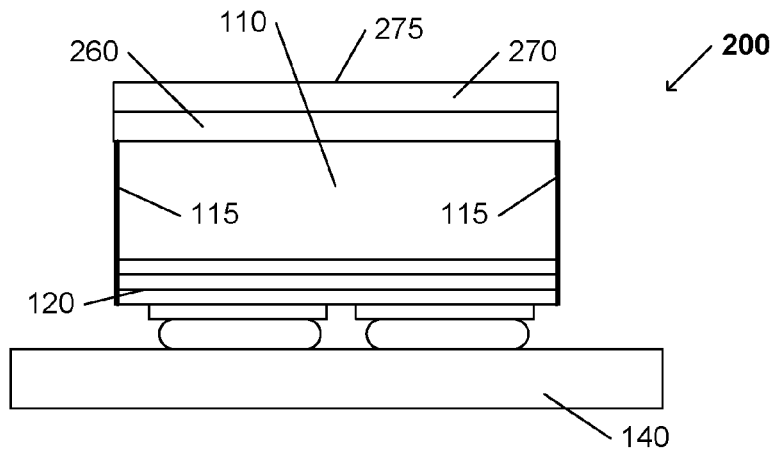
FIGS. 2A-2B illustrate example side-emitting LEDs with wavelength conversion sidewalls.
Figure 2B:
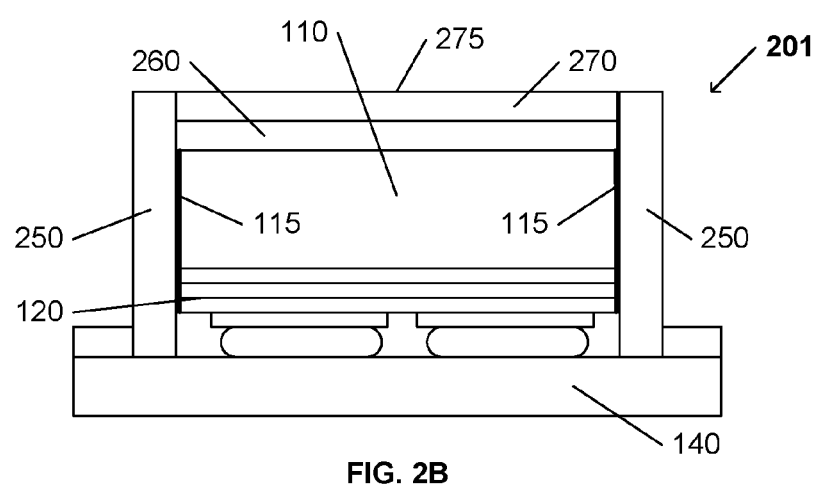

FIG. 2A illustrates an example side-emitting LED 200, and FIG. 2B illustrates this side-emitting LED 200 with wavelength conversion sidewalls 250, as side-emitting LED 201. As contrast to the side-emitting device 100 of FIG. 1C, in this embodiment, the growth substrate 110 is not removed; but rather, with reflective layers 260, 270, the growth substrate serves as a lightguide that directs the light emitted from the light emitting element 120 to the sidewalls 115 of the substrate 110. To enhance the light extraction efficiency of the sidewalls 115, the sidewalls 115 may be roughened to reduce the likelihood of total internal reflection (TIR) when the light strikes the sidewalls 115.

Figure 2C:
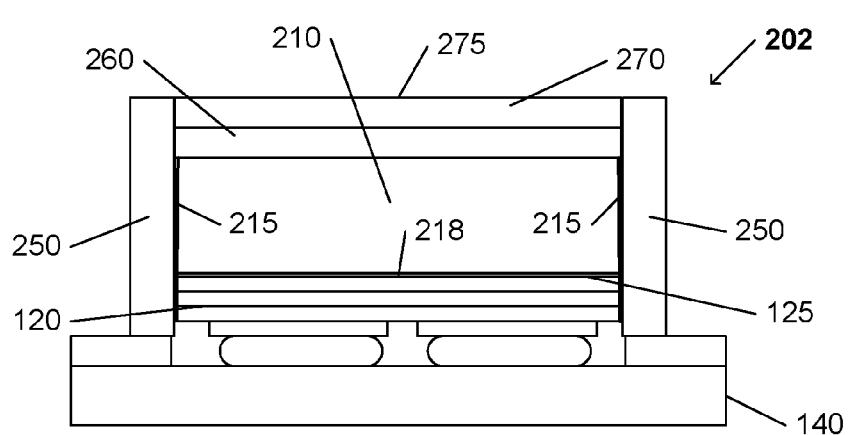

In the example embodiments of FIGS. 2A, 2B, 2C, the reflective layer 260 may be a specular reflector, and the reflective layer 270 may be a diffuse reflector. A specular reflector may be a distributed Bragg reflector (DBR) formed of organic or inorganic layers. The specular reflector may also be a layer of aluminum, silver or other reflective metal, or a combination of DBR and metal, or titanium oxide particles in a solgel solution. A diffusing reflector may be formed of a metal deposited on a roughed surface or a diffusing material such as a suitable white paint, which may also serve as a protective layer for the specular reflector.

Although the reflectors may be in either order, placing a specular reflector adjacent the substrate 110 reduces the likelihood of light being reflected back into the light emitting element 120, particularly if the light emitting element 120 is structured to emit less light in a direction normal to the surface, compared to light emitted at a non-orthogonal angle, as detailed further below.

The diffuse reflector 270 is provided to diffusely reflect light that escapes through the specular reflector 260. Additionally, the upper surface 275 of the diffuse reflector 270 will also be diffusely reflective; and, in an application such as a backlight or a troffer, this diffuse reflection on the upper surface 275 of the reflector 270 may prevent or reduce the appearance of a "dark spot" when the device 200 is viewed from above the surface 275.

As noted above, to further enhance the side-emission efficiency, the light emitting element 120 may be constructed to produce an emissions pattern with emission 'lobes' that are not orthogonal to the light emitting surface (e.g. forming a "bat-wing" emission pattern, wherein the emissions in the normal direction are less than emissions at a non-orthogonal angle to the surface 125 of the light emitting element 120). For example, if a majority of light is emitted from the light emitting surface at an angle greater than 45 degrees relative to normal, the likelihood of this light striking the sidewall 115 at an angle that is within the 'escape cone' of the sidewall 115 is substantially increased.

As disclosed in U.S. patent application 61/836,775, "LED WITH PATTERNED SURFACE FEATURES BASED ON EMISSION FIELD PATTERNS", filed Jun. 19, 2013 for Toni Lopez, and incorporated by reference herein, the distance between the quantum well within the light emitting element 120 and a reflective surface (opposite the light extraction surface) can be controlled to provide a desired light output pattern. As disclosed by J. J. Wierer et al, in "InGaN—GaN quantum-well heterostructure light-emitting diodes employing photonic crystal structures", APPLIED PHYSICS LETTERS VOLUME 84, NUMBER 19, 10 May 2004, and discussed further below, a photonic crystal layer may be created at the light emitting surface that causes the light to be deflected away from the normal to the surface, producing a "bat-wing" light output patterns.

In the embodiment of FIG. 2B, a wavelength conversion element 250 is situated at one or more of the light-emitting sidewalls 115 of the substrate 110. As in the example device 100, some of the sidewalls of the substrate 110 may be reflective, and correspondingly would not have an attached wavelength conversion element 250. The wavelength conversion element 250 may be, for example, a phosphor that is deposited or glued onto the substrate 110.

In the example prior art side-emitting LED 100, wavelength conversion particles are distributed throughout the wavelength conversion element 150. When light from the light emitting element strikes the wavelength conversion particle, it is absorbed and light of a different wavelength is emitted in a random direction. This absorption and re-emission process interferes with the "light-guide" properties of the wavelength conversion element 150. Of particular note, the density/concentration of wavelength conversion particles in the wavelength conversion element 150 will determine whether the element 150 operates primarily as a lightguide or a diffuser.

In the example side-emitting LED 200/201, the substrate 110 is a transparent medium, such as sapphire, which offers minimal interference or absorption to the light within the lightguide. Accordingly, the light that is emitted from the sidewalls 115 of the substrate 110 may be well controlled and predictable.

Of particular note, the light that is emitted from the sidewalls 115 of the substrate 110 of the LED 200 of FIG. 2A is not dependent upon a phosphor content in the substrate 110, and may be marketed as a 'core' side-emitting device 200 with known characteristics, to which a wavelength conversion element may be added to create side-emitting devices 201 with particular light output color characteristic. Because the light emitting surface of the light emitting element 120 is protected by the substrate 110, the side emitting LED 200 can be handled and manipulated in a process that is independent of the process used to create the LED 200.

Additionally, because the LED 200 may be tested before being provided to the process that attaches the wavelength conversion element 250, the wavelength conversion element 250 will only be applied to properly operating LEDs 200.

Because the process of attaching the wavelength conversion element 250 of the side-emitting LED 201 is independent of the process that provides the side-emitting LED 200, and because the light output characteristics of the side-emitting substrate 110 of the LED 200 is controllable and predictable, the particular wavelength conversion element 250 of the LED 201 can be designed to provide the desired light output characteristics, including a desired color point. Similarly, the choice of wavelength conversion element 250 may be based on trial-and-error tests with operating side-emitting LEDs 200.

As disclosed in USP U.S. Pat. No. 7,344,952, "LAMINATING ENCAPSULANT FILM CONTAINING PHOSPHOR OVER LEDS", issued 3 Jul. 2008 to Haryanto Chandra, and incorporated by reference herein, discloses providing a variety of phosphor elements, with varying wavelength conversion properties, and selecting a particular element to provide a particular light output based on the combination of the lights produced by the particular light emitting elements and the selected phosphor element. In an example embodiment, the light output of the light emitted devices 200 may be characterized, and subsets of the devices 200 having similar light output characteristics may be 'binned' together. Thereafter, a particular phosphor element is selected such that the combination of the light output characteristics of the LEDs 200 from a particular bin and the light conversion characteristics of the selected phosphor element provide a composite light output having a desired color and/or color temperature. By pairing a group of similarly performing light emitting devices 200 with a phosphor composition 250 that is selected based on the particular characteristics of the group, the variance of the composite light output among devices formed in this manner is substantially reduced.

Additionally, allowing the same side-emitting LED 200 to be used with different wavelength conversion elements 250 to satisfy different application requirements allows for economies of scale that may not be achievable for custom designed LEDs with integral wavelength conversion elements, such as the prior art side-emitting LED 100 of FIG. 1C.

Although the use of the growth substrate 110 as a light-guide in the side-emitting LED 200 substantially simplifies the fabrication process, one of skill in the art will recognize that, as illustrated in FIG. 2C, the growth substrate 110 may be removed and replaced with an element 210 with potentially better light-guide characteristics, or potentially better interface characteristics. Characteristics such as transparency, refractive index, thermal conductivity, coefficient of thermal expansion, durability, and others may influence the choice of material of element 210, with glass or transparent ceramic being common alternatives to the sapphire growth substrate 110. Among transparent ceramics, the element 210 may comprise transparent ceramics such as Alumina ($Al_2O_3$), Spinel($MgAl_2O_4$), AlON($Al_{23}O_{27}N_5$), and $MgF_2$. Ceramics such as poly-crystalline aluminium-oxides may also be used to provide high thermal conductivity, although some optical scattering may occur.

Using a separate element 210 also provides the option of roughening the interface 218 between the element 210 and the light emitting element 120 to enhance the light extraction efficiency from the light emitting element 120 at this interface 218. The interface 218 may also be formed to provide a particular radiation pattern from the light emitting surface 215, using, for example interference filters that serve to refract the emitted light to provide a desired light output pattern.

In like manner, as disclosed in USPA 2011/0012148, "LIGHTING DEVICE WITH LIGHT SOURCES POSITIONED NEAR THE BOTTOM SURFACE OF A WAVEGUIDE", for Serge J. Bierhuizen, published 20 Jan. 2011 and incorporated by reference herein, the light emission surface of a light emitting element may be patterned with a photonic crystal to maximize emissions at large angles relative to a normal to the surface, such that, for example, over 50% of the light is emitted at angles greater than 45° relative to a normal to the light emitting surface.

Figure 3:
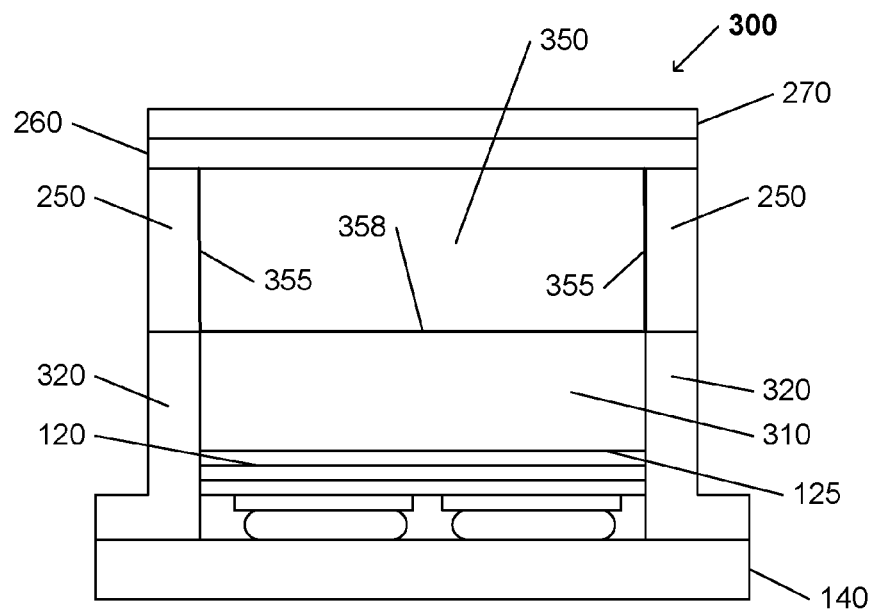
FIG. 3 illustrates an example side-emitting LED with stacked optical elements with progressively lower indices of refraction.

FIG. 3 illustrates an example side-emitting LED 300 with stacked optical elements with progressively lower indices of refraction. In this example embodiment, optical element 350 has a lower index of refraction than optical element 310, and the wavelength conversion element 250 has the same or lower index of refraction than optical element 350. In this embodiment, the optical element 350 corresponds to the transparent lightguide element below the reflectors 260-270.

Optionally, the interface 355 between the optical element 350 and the wavelength conversion element 250 or the interface 358 between the optical element 350 and the optical element 310, may be roughened to enhance the light extraction efficiency across these interfaces, or otherwise processed to provide a desired light output pattern. For example, the interface 355 may include interference filters, photonic crystals, and the like that serve to direct light from the optical element 310 at a non-orthogonal angle relative to the surface of the interface 355 (a 'bat-wing' emission pattern). In like manner, the interface 358 may include elements that serve to increase the amount of light that is emitted normal to the interface 358 (i.e. normal to the sides of the LED 300) to enhance the side emission characteristics of the device 300.

As in the examples of FIGS. 2A-2C, a 'core' side emitting light emitting device may be provided, corresponding to the LED 300 without a wavelength conversion element 250. As in the case of LED 200, because the second optical element 350 does not contain wavelength converting particles, the optical element 350 may be selected for optimal lightguide/waveguide characteristics, and the light output characteristics of the core LED may be better controlled and/or predicted, compared, for example, to a phosphor embedded optical element.

In this example embodiment, a reflective sidewall 320 surrounds the light emitting element 120 and the first optical element 310. Optionally, this sidewall 320 may be a wavelength conversion element, or an extension of the wavelength conversion element 250. By providing a reflective sidewall 320, the second optical element 350 and wavelength conversion element 350 are elevated above the submount 140. This elevation allows greater flexibility in the arrangement of further optical elements to the side of the LED 300, such as a collimating lens that redirects downward and upward traveling light toward a horizontal direction.

The LED 300 of FIG. 3 may use a variety of materials for the optical elements 310, 350. The optical element 310 may be the original growth substrate 110, such as used in FIG. 2B, or it may be another element, such as a glass or transparent ceramic element that replaces the original growth substrate, such as used in FIG. 2C. As in the example of FIG. 2C, if the optical element 310 is a replacement of the substrate 110, the interface between the optical element 310 and the light emitting element 120 may be roughened to enhance the light extraction from the light emitting element 120, or otherwise processed to provide a desired light output pattern.

In like manner, the second optical element 350 may be any transparent material that is suitable for use as an optical waveguide, such as sapphire, glass, or transparent ceramic, and may be dependent upon the material selected for the optical element 310 and/or the material selected for the wavelength conversion element 250. As noted above, the index of refraction of the optical element 350 is preferably less than the index of refraction of the optical element 310, and equal to or greater than the index of refraction of the wavelength conversion element 350.

Figure 4:
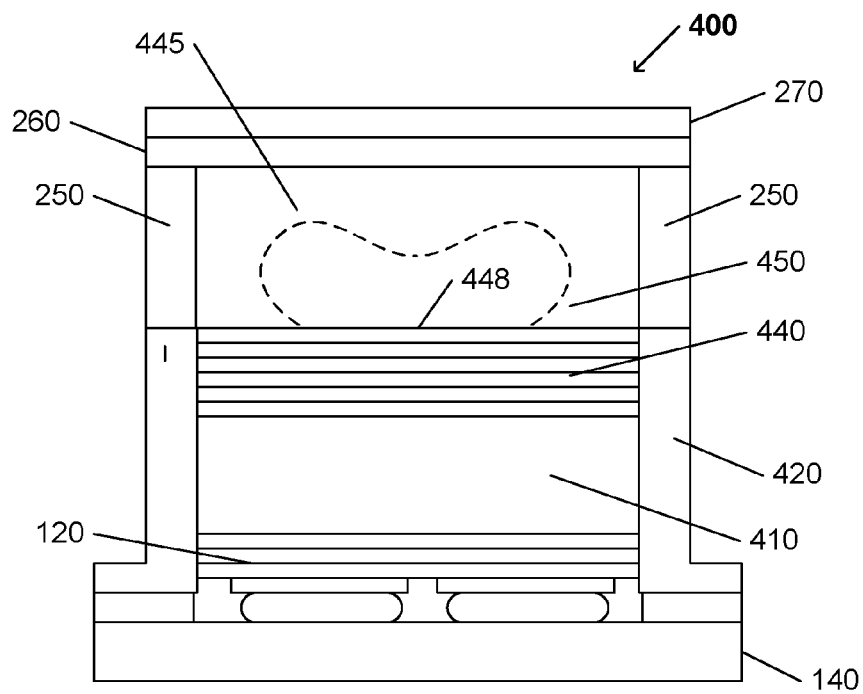
FIG. 4 illustrates an example side-emitting LED with an interference filter.

FIG. 4 illustrates an example side-emitting LED with an interference filter 440, between a first optical element 410 and a second optical element 450 that serves as a lightguide below the reflectors 260, 270. Optionally, the interference filter 440 may be situated between the light emitting element 120 and the first optical element 410.

The interference filter 440 is structured so as to deflect the light passing through the filter 440 away from the normal to the surface 448 of the filter 440, so as to create a light output intensity pattern 445 (the aforementioned "bat wing" pattern) that differs from the Lambertian pattern of a conventional light emitting surface. Because more light is emitted at an angle away from the normal, it is more likely that the light will exit through the wavelength conversion element 250, and the amount of light that is reflected from the reflector 260 back into the light emitting element 120 will be substantially reduced.

While the invention has been illustrated and described in detail in the drawings and foregoing description, such illustration and description are to be considered illustrative or exemplary and not restrictive; the invention is not limited to the disclosed embodiments.

Figure 5A:
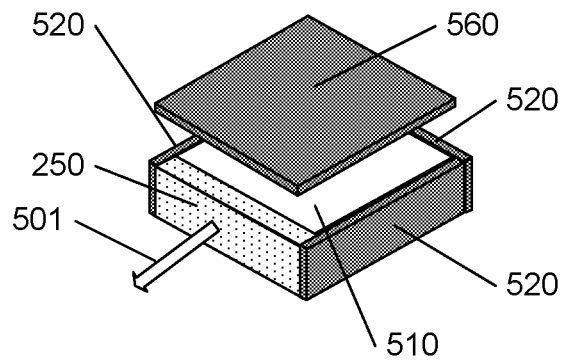
FIGS. 5A-5C illustrate example embodiments of side-emitting light emitting devices that emit light in select directions.
Figure 5B:
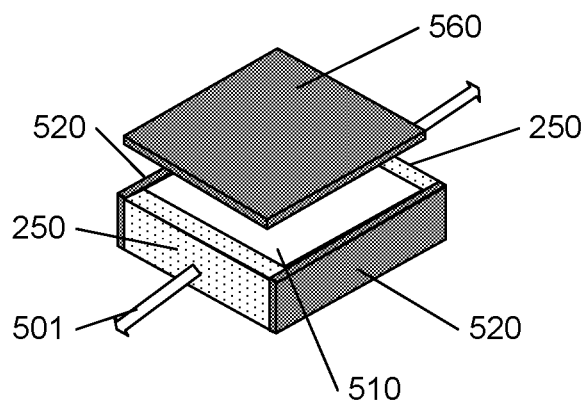
Figure 5C:
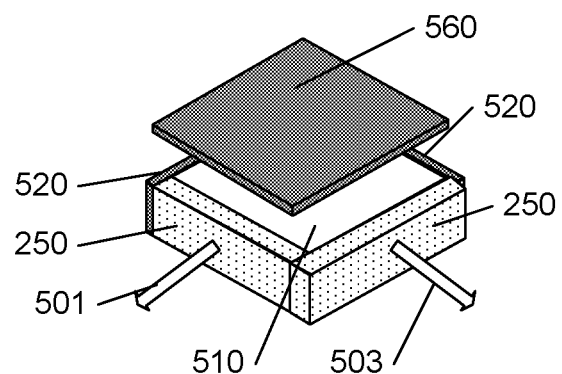

For example, as noted above, it is possible to operate the invention in an embodiment wherein light is not emitted from all of the sidewalls of the optical element. FIGS. 5A-5C illustrate example embodiments of side-emitting light emitting devices that emit light in select directions. Side emitters that emit light in select directions may be well suited for linear lighting devices, as well as edge-lit or corner-lit backlights.

As in the above examples, a reflective element 560, which may include specular and diffuse reflector layers, prevents light from exiting through the upper surface of the optical element 510, which may be the original growth substrate. In FIG. 5A, three of the sidewalls of the optical element 510 are coated with a reflective material 520, such that the emitted light 501 exits only from the non-reflective sidewall, through the wavelength conversion element 250. In like manner, in FIGS. 5B and 5C, two of the sidewalls are coated with reflective material 520, such that the emitted light 501-502 (FIG. 5B) and 501-503 (FIG. 5C) exits only from the non-reflective sidewalls, through the wavelength conversion element 250.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A side-emitting device, comprising:
a light emitting element having a light emitting surface that emits light in an upward direction,
a non-wavelength-converting lightguide element that is situated above the light emitting surface and receives the light emitted from the light emitting element,
top reflectors situated above the lightguide element that serve to direct the light in the lightguide element to exit from one or more first side surfaces of the lightguide element, the top reflectors comprising a specular reflector situated above the lightguide element and a diffusing reflector situated above the specular reflector, and
one or more wavelength conversion elements situated at the one or more first side surfaces of the lightguide element, which receive and convert some or all of the light emitted by the lightguide element to a different wavelength.

2. The device of claim 1, wherein the lightguide element comprises a growth substrate upon which the light emitting element was formed.

3. The device of claim 1, wherein the lightguide element comprises one of sapphire, glass, and transparent ceramic.

4. The device of claim 1, wherein the light emitting element is configured to provide a light output pattern from the light emitting surface with a luminance in at least one direction that is greater than the luminance in a direction normal to the light emitting surface.

5. The device of claim 1, further comprising one or more side reflectors situated at one or more second side surfaces of the lightguide element so the light emitted by the lightguide element exits only from the one or more first side surfaces of the lightguide element.

6. A side-emitting device, comprising:
a light emitting element having a light emitting surface that emits light in an upward direction,
a first optical element situated above the light emitting element,
an interface between the light emitting element and the first optical element,
one or more reflective elements situated on sidewalls of the first optical element,
a second optical element situated above the first optical element, the second optical element having a same or lower index of refraction than the first optical element, the second optical element comprising a non-wavelength-converting lightguide element that receives the light emitted from the light emitting element through the first optical element, one or more top reflectors situated above the lightguide element that serve to direct the light in the lightguide element to exit from one or more side surfaces of the lightguide element, and one or more wavelength conversion elements situated on the one or more side surfaces of the lightguide element, which receive and convert some or all of the light emitted by the lightguide element to a different wavelength.

7. The device of claim 6, wherein the first optical element comprises a growth substrate upon which the light emitting element was formed.

8. The device of claim 6, wherein the first optical element comprises one of sapphire, glass, and transparent ceramic.

9. The device of claim 6, wherein the lightguide element comprises one of sapphire, glass, and transparent ceramic.

10. The device of claim 6, wherein the light emitting element is configured to provide a light output pattern with a luminance in at least one direction that is greater than the luminance in a direction normal to the light emitting surface.

11. The device of claim 6, including an interference filter situated between the first and the second optical elements, the interference filter providing a light output pattern from a surface of the interference filter with a luminance in at least one direction that is greater than the luminance in a direction normal to the light emitting surface.

12. The device of claim 6, wherein the one or more top reflectors comprise:
a specular reflector that is situated above the lightguide element, and
a diffusing reflector that is situated above the specular reflector.

13. A method of forming a side-emitting device, comprising:
providing a light emitting element having a light emitting surface that emits light in an upward direction,
providing a non-wavelength-converting lightguide element that is situated above the light emitting surface,
providing top reflectors situated above the lightguide element that serve to direct light in the lightguide element to exit one or more first side surfaces of the lightguide element, the top reflectors comprising a specular reflector situated above the lightguide element and a diffusing reflector is situated above the specular reflector, and
providing one or more wavelength conversion elements situated at the one or more first side surfaces of the lightguide element to receive and convert some or all of the light emitted by the lightguide element to a different wavelength.

14. The method of claim 13, wherein providing the lightguide element and the light emitting element includes providing a growth substrate upon which the light emitting element is formed.

15. The method of claim 13, further comprising providing one or more side reflectors situated at one or more second side surfaces of the lightguide element so the light emitted by the lightguide element exits only from the one or more first side surfaces of the lightguide element.

16. A method of forming a side-emitting device comprising:
providing a light emitting element having a light emitting surface that emits light in an upward direction,
providing a first optical element situated above the light emitting element, an interface existing between the light emitting element and the first optical element,
providing one or more reflective elements situated on sidewalls of the first optical element,
providing a second optical element situated above the first optical element, the second optical element having a same or lower index of refraction than the first optical element, the second optical element comprising a non-wavelength-converting lightguide element that receives the light emitted from the light emitting element through the first optical element,
providing one or more top reflectors situated above the lightguide element that serve to direct light in the lightguide element to exit one or more side surfaces of the lightguide element, and
providing one or more wavelength conversion elements situated on the one or more side surfaces of the lightguide element to receive and convert some or all of the light emitted by the lightguide element to a different wavelength.

17. The method of claim 16, including providing an interference filter situated between the first and the second optical elements, the interference filter providing a light output pattern from a surface of the interference filter with a luminance in at least one direction that is greater than the luminance in a direction normal to the light emitting surface.

18. The method of claim 16, wherein said providing one or more top reflectors comprises:
providing a specular reflector that is situated above the lightguide element, and
providing a diffusing reflector that is situated above the specular reflector.

19. The method of claim 16, wherein the first optical element comprises a growth substrate upon which the light emitting element was formed.

20. The method of claim 16, wherein the first optical element comprises one of sapphire, glass, and transparent ceramic.

21. The method of claim 16, wherein the lightguide element comprises one of sapphire, glass, and transparent ceramic.

22. The method of claim 16, wherein the light emitting element is configured to provide a light output pattern with a luminance in at least one direction that is greater than the luminance in a direction normal to the light emitting surface.

* * * * *